US009528182B2

(12) United States Patent
Bluhm et al.

(10) Patent No.: US 9,528,182 B2
(45) Date of Patent: Dec. 27, 2016

(54) CHEMICAL VAPOR DEPOSITION USING N,O POLYDENTATE LIGAND COMPLEXES OF METALS

(75) Inventors: Martin E. Bluhm, Westfield, NJ (US); Gary S. Silverman, Chadds Ford, PA (US); Roman Y. Korotkov, Boothwyn, PA (US)

(73) Assignee: Arkema Inc., King of Prussia, PA (US)

( * ) Notice: Subject to any disclaimer, the term of this patent is extended or adjusted under 35 U.S.C. 154(b) by 490 days.

(21) Appl. No.: 13/377,858

(22) PCT Filed: Jun. 9, 2010

(86) PCT No.: PCT/US2010/037921
§ 371 (c)(1),
(2), (4) Date: Jan. 17, 2012

(87) PCT Pub. No.: WO2010/151430
PCT Pub. Date: Dec. 29, 2010

(65) Prior Publication Data
US 2013/0122192 A1 May 16, 2013

Related U.S. Application Data

(60) Provisional application No. 61/219,092, filed on Jun. 22, 2009.

(51) Int. Cl.
C23C 16/40 (2006.01)
(52) U.S. Cl.
CPC ............. *C23C 16/407* (2013.01); *C23C 16/40* (2013.01)
(58) Field of Classification Search
CPC .................................................. C23C 16/407
USPC ...................................... 427/126.3
See application file for complete search history.

(56) References Cited

U.S. PATENT DOCUMENTS

| 3,356,474 | A | 12/1967 | Loukes et al. |
| 3,443,612 | A | 3/1969 | Dickinson et al. |
| 3,531,274 | A | 9/1970 | Dickinson et al. |
| 3,790,361 | A | 2/1974 | Lawrenson |
| 4,751,149 | A | 6/1988 | Vijayakumar et al. |
| 4,990,286 | A | 2/1991 | Gordon |
| 5,124,180 | A | 6/1992 | Proscia |
| 5,306,522 | A | 4/1994 | Clough et al. |
| 5,342,676 | A | 8/1994 | Zagdoun |
| 5,407,743 | A | 4/1995 | Clough et al. |
| 5,458,753 | A | 10/1995 | Sato et al. |
| 5,545,443 | A | 8/1996 | Yamada et al. |
| 5,820,664 | A * | 10/1998 | Gardiner et al. ........ 106/287.17 |
| 6,268,019 | B1 | 7/2001 | Florczak |
| 6,569,548 | B2 | 5/2003 | Yamamoto et al. |
| 7,390,731 | B2 | 6/2008 | Kroll et al. |
| 2005/0064211 | A1* | 3/2005 | Deavenport et al. ......... 428/457 |
| 2006/0145142 | A1* | 7/2006 | Norman ........................ 257/40 |
| 2007/0248754 | A1* | 10/2007 | Lei et al. ................... 427/248.1 |
| 2007/0264429 | A1 | 11/2007 | Hamilton |
| 2008/0057225 | A1 | 3/2008 | Stricker et al. |
| 2008/0057321 | A1* | 3/2008 | Smith et al. .................. 428/427 |
| 2008/0063793 | A1* | 3/2008 | Abrams ................ C03C 17/245 427/109 |
| 2009/0081842 | A1 | 3/2009 | Nelson et al. |

OTHER PUBLICATIONS

Schumann, H., Frick, M., Heymer, B., Girgsdies, F., "Intramolecularly Stabilized Organoaluminum and Organogallium Compounds: Synthesis and X-Ray Crystal Structures of Some Dimethylaluminum and -Gallium Alkoxides Me2M-O-R-OR' and amides Me2M-NH-R-OR'", 1996, Journal of Organometallic Chemistry, 512, p. 117-126.*
Bradley D. Fahlman, Recent Advances in Chemical Vapor Deposition—Current Organic Chemistry-2006, 10, 1021-1033.

\* cited by examiner

Primary Examiner — Katherine A. Bareford
Assistant Examiner — Christina McClure
(74) Attorney, Agent, or Firm — Lynn B. Morreale

(57) ABSTRACT

Complexes of metals and N,O polydentate ligands are useful as precursors in the preparation of doped zinc oxide coatings by chemical vapor deposition.

7 Claims, No Drawings

CHEMICAL VAPOR DEPOSITION USING N,O POLYDENTATE LIGAND COMPLEXES OF METALS

GOVERNMENT RIGHTS STATEMENT

This invention was made with government support under Contract No. DE-FC26-08NT01576 awarded by the Department of Energy. The Government has certain rights in this invention.

FIELD OF THE INVENTION

The present invention is directed to chemical vapor deposition processes. More particularly, the present invention is directed to methods of carrying out chemical vapor deposition utilizing metal-containing precursors to form doped zinc oxide coatings.

BACKGROUND OF THE RELATED ART

Chemical vapor deposition (CVD) is a chemical process used to produce high-purity, high-performance solid materials and is often used in the semiconductor industry to produce thin films. In a typical CVD process, a substrate is exposed to one or more volatile precursors, which react and/or decompose on the substrate surface to produce the desired deposit or film. The deposit or film may contain one or more types of metal atoms, which may be in the form of metals, metal oxides, metal nitrides or the like following reaction and/or decomposition of the precursors. Any volatile by-products that are also produced are typically removed by gas flow through the reaction chamber.

A number of different types of CVD are in wide use and are frequently referenced in the literature. These processes vary with respect to the means by which chemical reactions are initiated (e.g., the activation process) and the process conditions employed.

Chemical vapor deposition (CVD) precursors that are both volatile and easily handled are often needed for various applications. The limited availability of suitable precursors for applications based on metal oxide films (such as flat panel displays, organic light-emitting diodes, low emissivity and solar control coatings, photovoltaic cells, and a variety of transparent, opto-, and high temperature electronic applications) is an obstacle to development of new CVD applications.

One major problem is the overall lack of suitable precursors for chemical vapor deposition processes such as atmospheric pressure chemical vapor deposition (APCVD). The precursor must exhibit sufficient thermal stability to prevent premature degradation or contamination of the substrate and at the same time facilitate easy handling. In some cases, the precursor must be depositable at a relatively low temperature in order to preserve the characteristics of the substrate or of the underlying layers previously formed. Additionally, precursors for use in codeposition processes, where more than one metal is deposited, must have no detrimental effect on the coherent deposition of layers when used in the presence of other precursors. Very few species have the desired combination of volatility (traditionally obtained through the use of relatively low molecular-weight, fluorine-incorporating compounds) and stability (e.g., clean decomposition of the precursor to $M_xO_y$ at temperatures above those required for volatility). The present invention is directed to suitable precursors for chemical vapor deposition such as atmospheric pressure chemical vapor deposition (APCVD) of layers (films) of metal oxides (especially doped zinc oxides), in which the physical properties of the precursors (or films) may be controlled by the selection of particular ligands to complex the metals used in the precursors.

SUMMARY OF THE INVENTION

The present invention provides a method of forming a doped layer comprised of zinc oxide and at least one metal-containing species selected from the group consisting of Al-, Ga-, In-, Tl- and B-containing species (such as an Al oxide, Ga oxide, In oxide, Tl oxide or B oxide) on a substrate. The method comprises contacting a precursor vapor with the substrate to deposit the doped layer thereon. The precursor vapor is comprised of at least one primary precursor comprising at least one zinc-containing compound and at least one secondary precursor comprising at least one metal selected from the group consisting of Al, Ga, In, Tl and B complexed with at least one N,O polydentate ligand. The precursor vapor may be generated by volatilizing a precursor composition comprising the primary and secondary precursors or by separately volatilizing the primary and secondary precursors and admixing the resulting gaseous streams.

DETAILED DESCRIPTION OF THE INVENTION

This invention utilizes N,O polydentate ligand complexes of main group and transition metals for use as CVD precursors, including but not limited to complexes of aluminum, gallium, thallium, boron and indium. Such complexes can be utilized as secondary precursors for the purpose of introducing a metal such as Al, Ga, Tl, B or In as a dopant into a zinc oxide coating in order to modify the electrical conductance or other properties of the coating. The metal to which at least one N,O polydentate ligand is bound or coordinated may have additional coordinated or bound (ancillary) ligands; these ligands may include, for example, alkyls, aryls, hydrides, alkoxides, acetylacetonates and other beta-diketonates, amines, phosphines, alkenes, alkynes, allyls, cyclopentadienyls, carbonyls, nitriles, halides, oxides, ethers, imides, nitrides, and tetrahydrofurans. N,O polydentate ligand-ancillary ligand interactions may also be used to influence precursor properties.

The N,O polydentate ligands suitable for use in the present invention contain at least one nitrogen atom and at least one oxygen atom per molecule capable of bonding to or complexing with a metal atom. N,O bidentate ligands containing one nitrogen atom and one oxygen atom per molecule that are each capable of bonding to or complexing with a metal atom are especially useful.

In one embodiment, the nitrogen atom is in the form of an enamine (e.g., C=C—NHR, wherein R is an aryl group such as a phenyl group or substituted phenyl group) or a lower alkyl group (e.g., a $C_1$-$C_6$ alkyl group such as methyl, ethyl, propyl, butyl, or hexyl, including all isomers thereof). The enamine thus may be a tautomer of an imine group (e.g., CH—C=NR). In another embodiment, the oxygen atom is in the form of a ketone (C=O). In one aspect of the invention, the ligand contains both an enamine (or imine) group and a ketone group which are arranged such that they are capable of forming a six-membered ring including an oxygen atom, a nitrogen atom and a metal atom when complexed with such metal atom. For example, the imine group and the ketone group may be beta to each other, such that they are separated by a carbon atom. The N,O polydentate ligand may, for example, have the general structure (I):

  (I)

or a tautomer thereof; i.e., $R^1C(=O)C(R^2)=C(NHR^3)R^4$, wherein $R^1$ and $R^4$ are the same or different and are methyl, ethyl, fluoromethyl or fluoroethyl, $R^2$ is H, methyl or fluoromethyl, and $R^3$ is aryl or $C_1$-$C_6$ alkyl. Such ligands may be prepared from the corresponding beta-diketone by reacting one of the ketone groups with a primary amine, using methods well known in the art.

Ligands of this type may be reacted with a trialkyl metal compound having the general structure $R^5R^6R^7M$, where $R^5$, $R^6$ and $R^7$ are the same or different and are $C_1$-$C_6$ alkyl and M is Al, Ga, In, Tl or B. Exemplary trialkyl metal compounds include trimethyl aluminum, triethyl aluminum, trimethyl boron, triethyl boron and the like. The N,O polydentate ligand/metal complexes thereby formed, which are suitable for use as precursors in the chemical vapor deposition process of the present invention, may have the following general structure (II):

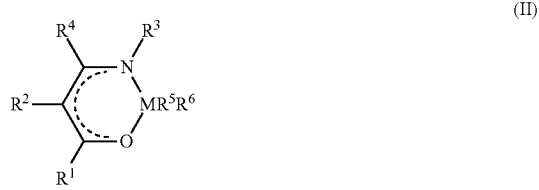  (II)

wherein $R^1$-$R^6$ and M have the same meaning as set forth previously with respect to the starting materials used to prepare the complex.

In another embodiment, the N,O polydentate ligand contains an oxygen atom, a nitrogen atom, and an active hydrogen attached to either said oxygen atom or said nitrogen atom, wherein said oxygen atom and said nitrogen atom are separated by two or three carbon atoms. Such ligands may, for example, have the general structure (III):

  (III)

or general structure (IV):

  (IV)

wherein n=2 or 3, $R^8$ is $C_1$-$C_6$ alkyl or aryl, $R^9$ and $R^{10}$ are the same or different and are H, $C_1$-$C_6$ alkyl, or aryl, and $R^{11}$-$R^{13}$ are the same or different and are $C_1$-$C_6$ alkyl or aryl. In one embodiment, $R^8$ is methyl or ethyl, $R^9$ and $R^{10}$ are H, and $R^{11}R^{13}$ are independently methyl or ethyl.

Such ligands may be reacted with a trialkyl metal compound having the general structure $R^5R^6R^7M$, where $R^5$, $R^6$ and $R^7$ are the same or different and are $C_1$-$C_6$ alkyl and M is Al, Ga, In, Tl or B. Exemplary trialkyl metal compounds include trimethyl aluminum, triethyl aluminum, trimethyl boron, triethyl boron and the like.

Complexes prepared in this manner and suitable for use as precursors in the present invention thus may have general structure (V):

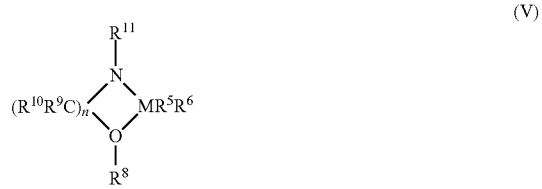  (V)

or general structure (VI):

  (VI)

wherein n, $R^5$-$R^{16}$ and M have the same meaning as set forth previously with respect to the starting materials used to prepare the complexes.

The aforedescribed complexes of metals and N,O polydentate ligands may be used as secondary precursors in combination with one or more primary precursors based on zinc-containing compounds.

The zinc-containing compound may correspond to the general formula $R^1R^2Zn$ or $R^1R^2Zn.[L]_n$, where $R^1$ and $R^2$ are the same or different and are selected from alkyl groups or aryl groups, L is a ligand, n is 1 if L is a polydentate ligand (e.g., a bidentate or tridentate ligand) and n is 2 if L is a monodentate ligand. Suitable ligands include, for example, ethers, amines, amides, esters, ketones, and the like. A polydentate ligand may contain more than one type of functional group capable of coordinating with the zinc atom.

For example, suitable zinc-containing compounds include, but are not limited to, compounds of the general formula:

$R^1R^2Zn.L_z$ or $R^1R^2Zn.[R^3R^4N(CHR^5)_n(CH_2)_m(CHR^6)_nNR^7R^8]$ where $R^{1-8}$ can be the same or different alkyl or aryl groups such as methyl, ethyl, isopropyl, n-propyl, n-butyl, sec-butyl, phenyl or substituted phenyl, and may include one or more fluorine-containing substituents, L is a oxygen-based, neutral ligand such as an ether, ketone or ester and z=0-2. $R^5$ and $R^6$ can be H or alkyl or aryl groups, n can be 0 or 1, and m can be 1-6 if n is 0, and m can be 0-6 if n is 1.

Other suitable zinc compounds may include dialkyl zinc glycol alkyl ethers of the general formula:

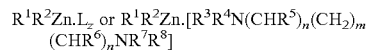

where $R^9$ is a short chain, saturated organic group having 1 to 4 carbon atoms (with the two $R^9$ groups being the same or different) and $R^{10}$ is a short chain, saturated organic group having 1 to 4 carbon atoms. Preferably, $R^9$ is a methyl or ethyl group and $R^{10}$ is a methyl group and is referred to as diethylzinc (DEZ) diglyme having the formula:

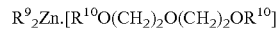

Other tridentate ligands capable of chelating the dialkyl zinc moiety that may be useful in connection with the present invention include: compounds of the formula $[R^{11}C(OR^{12})_3]$ where $R^{11}$ is H or a short chain, saturated organic group having 1 to 4 carbon atoms or a phenyl group and $R^{12}$ is a short chain, saturated organic group having 1 to 4 carbon atoms as described above, where $R^{11}$ and $R^{12}$ may be the same or different, triamine ligands of the formula $[R^{13}{}_2N(CH_2)_2N(R^{14})(CH_2)_2NR^{13}{}_2]$ where $R^{13}$ is a short chain, saturated organic group having 1 to 4 carbon atoms and $R^{14}$ is a phenyl group or a substituted phenyl group. Diphenyl zinc compounds may also be useful in connection with the present invention.

Specific examples of suitable zinc-containing compounds include diethyl and dimethyl zinc adducts such as diethylzinc.TEEDA (TEEDA=N,N,N',N'-tetraethyl ethylenediamine), diethylzinc.TMEDA (TMEDA=N,N,N',N'-tetramethyl ethylenediamine), diethylzinc.TMPDA (TMPDA=N,N,N',N'-tetramethyl-1,3-propanediamine), dimethylzinc.TEEDA, dimethylzinc.TMEDA, and dimethylzinc.TMPDA.

Other suitable zinc-containing compounds include zinc carboxylates (e.g., zinc acetate, zinc propionate), zinc diketonates (e.g., zinc acetyl acetonate, zinc hexafluoroacetyl acetonate), dialkyl zinc compounds (e.g., diethyl zinc, dimethyl zinc), zinc chloride and the like.

The precursor vapor may further comprise one or more other types of precursors, in addition to the at least one zinc-containing compound and the at least one secondary precursor comprising at least one metal selected from the group consisting of Al, Ga, In, Tl and B complexed with at least one N,O polydentate ligand. For example, the precursor composition may be additionally comprised of one or more group 13 metal-containing precursors include those of the general formula:

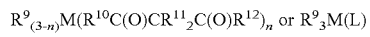

$$R^9{}_{(3-n)}M(R^{10}C(O)CR^{11}{}_2C(O)R^{12})_n \text{ or } R^9{}_3M(L)$$

wherein M=B, Al, Ga, In or Tl, $R^9$ is an alkyl or aryl or halide or alkoxide group, $R^{10\text{-}12}$ may be the same or different and are H, alkyl, or aryl groups (including cyclic and partially- and perfluorinated derivatives), n=0-3, and L=a neutral ligand capable of coordinating to the metal. A preferred gallium-containing precursor is dimethylgallium-hexafluoroacetylacetonate (commonly referred to as Me$_2$Ga(hfac)). Other suitable gallium-containing precursors include diethylgallium(hexafluoroacetylacetonate), trimethylgallium, trimethylgallium(tetrahydrofuran), triethylgallium(tetrahydrofuran), dimethylgallium(2,2,6,6-tetramethyl-3,5-heptanedionate), dimethylgallium(acetylacetonate), tris(acetylacetonate)gallium, tris(1,1,1-trifluoroacetylacetonate)gallium, tris(2,2,6,6-tetramethyl-3,5-heptanedionate)gallium and triethylgallium. Other gallium-containing compounds may also be suitable for use as precursors in the present invention.

Suitable aluminum-containing precursors include $R^1{}_{(3-n)}AlR^2{}_n$ and $R^1{}_3Al(L)$, where $R^1$ is methyl, ethyl, n-propyl, isopropyl, n-butyl, isobutyl, or octyl, $R^2$ is a halide or substituted or unsubstituted acetylacetonate derivative, including partially- and perfluorinated derivatives, n is 0-3, and L is a neutral ligand capable of coordinating to aluminum. Preferred aluminum containing precursors include diethyl aluminum acetylacetonate (Et$_2$Al(acac)), diethylaluminum chloride, diethylaluminum(hexafluoroacetylacetonate), diethylaluminum(1,1,1-trifluoroacetylacetonate), diethylaluminum(2,2,6,6-tetramethyl-3,5-heptanedionate), triethylaluminum, tris(n-butyl)aluminum, and triethylaluminum(tetrahydrofuran). Other aluminum-containing compounds may be suitable for use as precursors in the present invention.

Suitable boron-, indium- and thallium-containing compounds that can be utilized as dopant precursors include diborane as well as compounds analogous to the aluminum- and gallium-containing compounds mentioned above (e.g., compounds where a B, In or Tl atom is substituted for Al or Ga in any of the aforementioned aluminum- or gallium-containing precursors).

The amount of dopant (e.g., Al, B, Tl, In, Ga species, such as oxides) in the final doped oxide coating can be controlled as desired by controlling the composition of the precursor vapor, e.g., the relative amounts of the primary precursor(s) and the secondary precursor(s). In one embodiment, the oxide coating comprises about 0.1% to about 5%, or about 0.5% to about 3%, by weight of dopant oxide.

One or more additional components may also be contacted with the substrate when the precursor vapor is contacted with the substrate. These additional components may be admixed with the precursors before or simultaneous with contacting the precursor vapor with the substrate. For example, such admixing may take place at the same time the precursor vapor is contacted with the substrate (for example, a first stream comprising the precursor vapor and a second stream comprising the additional components) may be directed towards the substrate) or in advance of contacting the precursor vapor with the substrate (for example, a first stream comprising the precursor vapor and a second stream comprising the additional component(s) may be admixed to form a third stream comprised of the precursor vapor and the additional component(s), which is then directed towards the substrate).

Such additional components may include, for example, oxygen-containing compounds, particularly compounds that do not contain a metal such as esters, ketones, alcohols, hydrogen peroxide, oxygen (O$_2$), or water. One or more fluorine-containing compounds (e.g., fluorinated alkanes, fluorinated alkenes, fluorinated alcohols, fluorinated ketones, fluorinated carboxylic acids, fluorinated esters, fluorinated amines, HF or other compounds that contain F but not a metal) may also be utilized as an additional component. The precursor vapor may be admixed with an inert carrier gas such as nitrogen, helium, argon or the like.

Substrates suitable for use in the present invention include any of the substrates capable of having a zinc oxide-containing layer deposited thereon in a chemical vapor deposition process, including, for example, glass substrates (e.g., borosilicate glass), silicon substrates, plastic substrates and the like. Transparent inorganic substrates are especially suitable. If the transparent substrate material is glass, it may be formed by any suitable method, but is preferably a continuous glass ribbon formed by the well known float glass process as described in U.S. Pat. Nos. 3,356,474; 3,433,612; 3,531,274; and 3,790,361, each of which is herein incorporated by reference in its entirety for all purposes.

Possible applications of coatings made in accordance with the present invention include, but are not limited to, thin film photovoltaic and organic photovoltaic (OPV) devices, flat panel displays, liquid crystal display devices, solar cells, electrochromic absorbers and reflectors, energy-conserving heat mirrors, antistatic coatings (e.g., for photomasks), solid state lighting (LEDs and OLEDs), induction heating, gas sensors, optically transparent conductive films, transparent heater elements (e.g., for various antifogging equipment such as freezer showcases), touch panel screens, and thin film transistors (TFTs), as well as low emissivity and/or solar control layers and/or heat ray reflecting films in architectural and vehicular window applications and the like. Using the present invention, it is possible to obtain coatings that are electrically conductive, transparent to visible light, reflective to infrared radiation and/or absorbing to ultraviolet light. For example, zinc oxide-coated transparent substrate materials exhibiting high visible light transmittance, low emissivity properties and/or solar control properties as well as high electrical conductivity/low sheet resistance can be prepared by practice of the present invention.

The present invention may be readily adapted for use in the deposition of doped zinc oxide coatings on transparent substrates, such as the methods described in the following United States patents and published applications (each of which is incorporated herein by reference in its entirety for all purposes): U.S. Pat. Nos. 4,751,149; 4,990,286; 5,124,180; 5,306,522; 5,407,743; 5,545,443; 6,268,019; 5,342,676; 5,458,753; 6,569,548; 7,390,731; 2008-0057225; 2008-0063793; and 2008-0057321.

For example, the present invention is a cost effective method of making pyrolytic zinc oxide coatings at commercially viable growth rates on transparent substrate materials having a glass transition point (Tg) of less than 400° C., wherein the zinc oxide coating is deposited at a substrate temperature of less than 400° C. (e.g., between 80° C. and 400° C.). Illustrative examples of suitable substrate materials include, but are not limited to, polymeric substrates such as polyacrylates (e.g., polymethylmethacrylate), polyesters (e.g., polyethylene terephthalate), polyamides, polyimides, polycarbonates and the like.

In one embodiment, an electrically conductive doped zinc oxide-coated transparent product is prepared by an atmospheric chemical vapor deposition method comprising directing one or more streams of gaseous reactants comprising i) at least one zinc-containing compound, ii) at least one secondary precursor comprising at least one metal selected from the group consisting of Al, Ga, In, Tl and B complexed with at least one N,O polydentate ligand, and iii) at least one oxygen-containing compound (e.g., an ester, an alcohol, $O_2$ or water) onto a surface of a transparent substrate material heated to a temperature of less than 400° C. to deposit a zinc coating thereon. The deposition procedure and apparatus of U.S. Pat. No. 6,268,019 may advantageously be used in connection with such method, since the properties of the doped zinc oxide coating thereby obtained may be tuned or varied as desired by controlling the mixing time of the reactant materials. The one or more streams of gaseous reactants may contain one or more inert carrier gases. The gaseous reactants i), ii) and iii) may be mixed together for a sufficiently short time that the zinc oxide coating is formed on the substrate surface at a deposition rate of at least 5 nm/second. For example, i), ii) and iii) may be mixed together for less than 500 msec.

While the present invention has been described with respect to particular embodiments thereof, it is apparent that numerous other forms and modifications of the invention will be obvious to those skilled in the art. The appended claims and this invention generally should be construed to cover all such obvious forms and modifications that are within the true spirit and scope of the present invention.

EXAMPLES

Example 1

Preparation of an Enaminoketone Ligand

Racemic sec-butylamine (8.91 g; 0.12 mol) is added under an argon atmosphere to 12.20 g (0.12 mol) acetylacetone at room temperature. The resulting mixture is stirred under the argon atmosphere for 60 hours, then dried by adding magnesium sulfate. The suspension thereby obtained is filtered and washed with methylene chloride. The methylene chloride is removed from the filtrate under vacuum, yielding 18.9 g (0.12 mol; 100%) of the desired enaminoketone ligand.

Preparation of an Organometallic Complex of an Enaminoketone Ligand and Trimethylaluminum Trimethylaluminum (8.5 g; 0.118 mol) is dissolved under an argon atmosphere in 40 mL of dry diethyl ether. The resulting solution is cooled to −20° C. and 18.3 g (0.118 mol) of the enamineketone ligand prepared as described above are added over 20 minutes to the trimethylaluminum/diethyl ether mixture with stirring. The mixture thereby obtained is carefully heated until methane gas evolution is completed. The diethyl ether is then removed under vacuum to isolate 22.5 g (0.106 mol; 90%) of the desired neutral dimethylaluminum complex (1).

(1)

where R is methyl, X is O and Y is N-sec-butyl. Complex (1) had a vaporization temperature of 144° C. and provided 6.7% residue (as measured by DTA).

Example 2

The procedures of Example 1 are repeated using triethylaluminum instead of trimethylaluminum to yield diethylaluminum complex (2).

(2)

where R is ethyl, X is O and Y is N-sec-butyl. Complex (2) had a vaporization temperature of 75.6° C. and provided 22.1% residue (as measured by DTA).

Example 3

A complex of an enaminoketone having structure $H_3CC(=O)CH_2C(=NEt_2)CH_3$ and diethylzinc was prepared. This complex had a vaporization temperature of 123° C. and provided 50.2% residue (as measured by DTA).

Example 4

Preparation of Organometallic Complexes of Alkoxyamino Ligands and Trialkylaluminum A series of organometallic complexes was prepared by reacting one equivalent of the active hydrogen-containing alkoxyamino ligands shown in Table 1 with one equivalent of either trimethylaluminum or triethylaluminum in dry diethyl ether (the solution having been cooled to −20° C.). The resulting mixtures were then carefully heated and the diethyl ether removed under vacuum to isolate quantitatively the complexes. The vaporization temperature and % residue measured for each complex by DTA are shown in Table 1.

TABLE 1

| Example | Alkoxyamino Ligand | AlR$_3$ | Vaporization Temp., ° C. | Residue, % |
|---|---|---|---|---|
| 4a | H$_3$CO(CH$_2$)$_3$NHCH$_2$CH$_3$ | R = Et | 98.6 | 22.1 |
| 4b | H$_3$CO(CH$_2$)$_3$NH$_2$ | R = Et | 61.6 | 22.9 |
| 4c | H$_3$CO(CH$_2$)$_2$NH$_2$ | R = Et | 107.2 | 30.3 |
| 4d | HO(CH$_2$)$_3$N(CH$_3$)$_2$ | R = Et | 147.8 | 26.7 |
| 4e | H$_3$CO(CH$_2$)$_3$NHCH$_2$CH$_3$ | R = Me | 135.7 | 22.6 |
| 4f | H$_3$CO(CH$_2$)$_3$NH$_2$ | R = Me | 79.5 | 28.6 |
| 4g | H$_3$CO(CH$_2$)$_2$NH$_2$ | R = Me | 76.3 | 29.0 |
| 4h | HO(CH$_2$)$_3$N(CH$_3$)$_2$ | R = Me | 86.8 | 24.3 |

Example 5

Preparation of Organometallic Complexes of Alkoxyamino Ligands and Trialkylboron Two organometallic complexes were prepared by reacting one equivalent of the active hydrogen-containing alkoxyamino ligands shown in Table 2 with one equivalent of triethylboron in dry diethyl ether (the solution having been cooled to −30° C.). The resulting mixtures were then carefully heated until ethane gas evolution was completed and the diethyl ether removed under vacuum to isolate quantitatively the complexes. The % residue measured for each complex by DTA is shown in Table 2. The vaporization temperatures for the complexes could not be accurately determined due to interference by the THF solvent.

TABLE 2

| Example | Alkoxyamino Ligand | Residue, % |
|---|---|---|
| 5a | H$_3$CO(CH$_2$)$_3$NHCH$_2$CH$_3$ | 2.2 |
| 5b | H$_3$CO(CH$_2$)$_3$NH$_2$ | 1.3 |

What is claimed is:

1. A chemical vapor deposition method of forming a doped layer comprised of zinc oxide and at least one metal-containing species selected from the group consisting of Al- and B-containing species on a substrate, comprising contacting a precursor vapor with the substrate to deposit the doped layer thereon, wherein the precursor vapor consists of at least one primary precursor comprising at least one zinc-containing compound, at least one secondary precursor comprising a complex having a structure:

wherein n is 2 or 3, X is OR$^3$, Y is NR$^4$, M is Al or B, R$^1$, R$^2$, and R$^3$ are the same or different, and are methyl or ethyl, and R$^4$ is H, methyl or ethyl,
optionally at least one oxygen-containing compound that does not contain a metal or fluorine and that is selected from the group consisting of esters, ketones, alcohols, hydrogen peroxide, O$_2$ and water, and
an inert carrier gas.

2. The method of claim 1, wherein at least a portion of the precursor vapor is generated by volatilizing a precursor composition comprised of the least one primary precursor and the least one secondary precursor.

3. The method of claim 1, wherein the at least one primary precursor comprises at least one zinc-containing compound having the general formula R$^1$R$^2$Zn or R$^1$R$^2$Zn.[L]$_n$, where R$^1$ and R$^2$ are the same or different and are selected from alkyl groups or aryl groups, L is a ligand, n is 1 if L is a polydentate ligand and n is 2 if L is a monodentate ligand.

4. The method of claim 1, wherein a transparent conductive zinc oxide layer is formed on the substrate.

5. The method of claim 1, wherein the substrate is a glass substrate.

6. The method of claim 1, wherein said contacting is carried out at about atmospheric pressure.

7. The method of claim 1, wherein the substrate is maintained at a temperature of less than 400° C. during the contacting.

* * * * *